United States Patent
Sechen et al.

(12)

(10) Patent No.: US 6,549,038 B1
(45) Date of Patent: Apr. 15, 2003

(54) METHOD OF HIGH-PERFORMANCE CMOS DESIGN

(75) Inventors: Carl Sechen, Seattle, WA (US); Larry McMurchie, Seattle, WA (US); Tyler Thorp, Sunnyvale, CA (US); Gin Yee, Sunnyvale, CA (US)

(73) Assignee: University of Washington, Seattle, WA (US)

( * ) Notice: Subject to any disclaimer, the term of this patent is extended or adjusted under 35 U.S.C. 154(b) by 0 days.

(21) Appl. No.: 09/662,101

(22) Filed: Sep. 14, 2000

(51) Int. Cl.[7] .................. H03K 19/00; H03K 19/094
(52) U.S. Cl. ..................... 326/93; 326/112; 326/96
(58) Field of Search ................ 326/93, 95–98, 326/104, 112, 119, 121

(56) References Cited

U.S. PATENT DOCUMENTS

| | | | | |
|---|---|---|---|---|
| 3,852,625 A | * | 12/1974 | Kubo ........................... | 326/97 |
| 4,692,637 A | * | 9/1987 | Shoji ........................... | 326/94 |
| 4,841,174 A | * | 6/1989 | Chung et al. ................. | 326/45 |
| 5,073,726 A | * | 12/1991 | Kato et al. .................... | 326/24 |
| 5,880,609 A | * | 3/1999 | Klass et al. ................... | 326/93 |
| 5,999,019 A | * | 12/1999 | Zheng et al. .................. | 326/98 |
| 6,118,304 A | * | 9/2000 | Potter et al. .................. | 326/93 |

OTHER PUBLICATIONS

Z. Zhu & B. Carson, "Critical Voltage Transition Logic: An Ultrafast CMOS Logic Family", which appears on pp. 732–737 of Proceedings 1997 International Conference on Computer Design: VLSI in Computers & Processors, ICCD '97, Austin, Texas, USA, Oct. 12–15, 1997. IEEE Computer Society Press, 1997, ISBN 0–8186–8026–X.

* cited by examiner

*Primary Examiner*—Michael Tokar
*Assistant Examiner*—James H Cho
(74) *Attorney, Agent, or Firm*—Blakely Sokoloff Taylor & Zafman LLP

(57) ABSTRACT

A method for improving the speed of conventional CMOS logic families is disclosed. When applied to static CMOS, OPL retains the restoring character of the logic family, including its high noise margins. Speedups of 2× to 3× over (optimized) conventional static CMOS are demonstrated for a variety of circuits, ranging from chains of gates, to datapath circuits, and to random logic benchmarks. Such speedups are obtained using identical netlists without remapping. When applied to pseudo-nMOS and dynamic families, in combination with remapping to wide-input NORs, OPL yields speedups of 4× to 5× over static CMOS. Since OPL applied to static CMOS is faster than conventional domino logic, and since it has higher noise margins than domino logic, we believe it will scale much better than domino with future processing technologies.

16 Claims, 9 Drawing Sheets

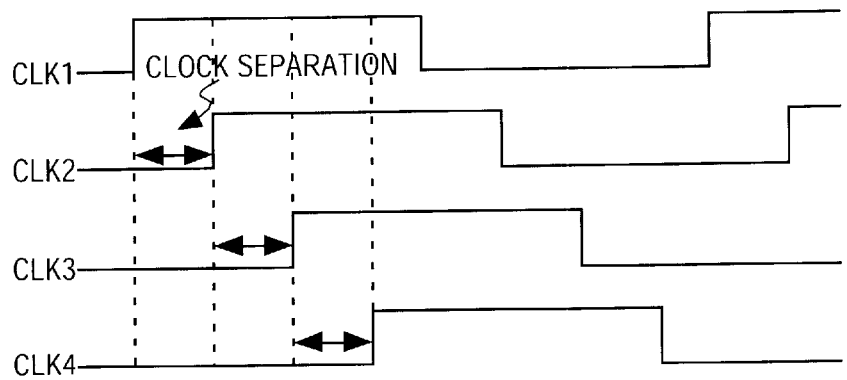
FIG. 3A CLK1
FIG. 3B CLK2
FIG. 3C CLK3
FIG. 3D CLK4
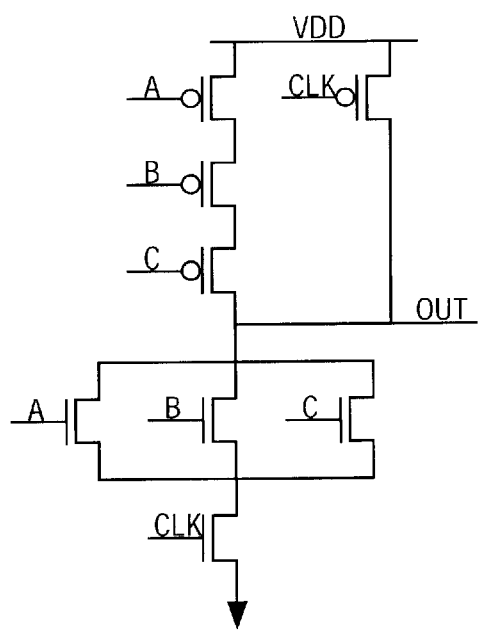
FIGURE 4

METHOD OF HIGH-PERFORMANCE CMOS DESIGN

GOVERNMENTAL RIGHTS

The U.S. Government has a paid-up license in this invention and the right in limited circumstances to require the patent owner to license others on reasonable terms as provided for by the terms of Grant No. CCR9901166 from the National Science Foundation.

TECHNICAL FIELD OF THE INVENTION

The present invention relates to complementary metal oxide semiconductor (CMOS) logic, and more particularly, to a design method for increasing the speed of the CMOS logic using output prediction techniques.

BACKGROUND OF THE INVENTION

CMOS circuitry is commonly used to implement logic functions, such as NOR and NAND gates. Traditionally, such CMOS logic gates have been constructed by the interconnection of transistors whose terminals are connected to the inputs of the gates. For complex CMOS logic circuits, the digital signals must oftentimes propagate through several levels of gates before finally providing an output signal. These "static" CMOS logic circuits have been favored because of their high noise immunity and easy technology mapping. One major disadvantage of such static circuits, however, has been their relatively slow speed.

Dynamic CMOS logic was developed to allow increased speed. Dynamic CMOS logic circuits perform combinational functions using a clock signal. One type of dynamic CMOS logic is known as domino logic. Domino CMOS logic is commonly used in high-performance microprocessors for obtaining timing goals that are not possible using static CMOS logic. See e.g. "A New Family of Semi-Dynamic and Dynamic Flip-Flops with Embedded Logic for UltraSPARC-III," F. Klass et al., IEEE J. Solid State Circuits, Vol. 34, No. 5, pp. 712–717 (May 1999); "Clock Delayed Domino for Adder and Random Logic Design," G. Yee et al., Proc. IEEE Int'l Conf. on Computer Design (ICCD) (October 1996).

The increased performance of domino logic is due to reduced input capacitance, lower switching thresholds, and circuit implementations that typically use fewer levels of logic due to the use of efficient and wide complex gates. Dynamic CMOS logic can be used to realize an average speed improvement of about 60% over static CMOS logic for random logic blocks.

However, dynamic CMOS logic circuits have notable disadvantages. In the case of domino CMOS logic, logic must be mapped to a unate network, which usually requires duplication of logic. Perhaps the main disadvantage is the increased noise sensitivity compared to static CMOS logic.

BRIEF DESCRIPTION OF THE DRAWINGS

The present invention is illustrated by way of example and not limitation in the accompanying figures.

FIGS. 3A–3D are timing diagrams for the clocking signal to each of the stages in FIG. 2.

FIG. 4 is a schematic diagram of a three input NOR gate formed in accordance with the present invention.

DETAILED DESCRIPTION OF THE PREFERRED EMBODIMENT

The present invention describes a method that can be applied to a variety of inverting logic families to increase speed while retaining the attributes of the underlying family. The method is referred to as output prediction logic or OPL. OPL relies on the alternating nature of logic output values for inverting gates on the critical path. That is, for any critical path, the logic output values of the gates along that path will be alternating ones and zeros. By correctly predicting exactly one half of the gate outputs, OPL obtains significant speedups (at least two times) over the underlying logic families (e.g. static CMOS logic, pseudo-nMOS and dynamic CMOS logic).

Although OPL employs clocks, OPL-static is inherently restoring logic and has the same noise margins as conventional static CMOS logic. OPL-static is also highly tolerant to clock skew, guaranteeing functionally correct results regardless of skew. Additionally, OPL-static uses the same synthesis tools as static CMOS logic (e.g. tools provided by Synopsys, Inc. of Mountain View, Calif.). OPL can be applied to the same netlists as conventional static CMOS logic with a simple cell-for-cell substitution.

For the efficient implementation of wide NOR gates, designers often choose gates from pseudo-nMOS or dynamic logic families. OPL can be applied to these families as well. For example, a carry look ahead (CLA) adder implementation using OPL-pseudo-nMOS for wide-input NORs may obtain a speedup of over five times over an optimized static CMOS implementation. These speedups were obtained while employing conservative noise margins.

Application to Static CMOS Circuits

Figure 1:
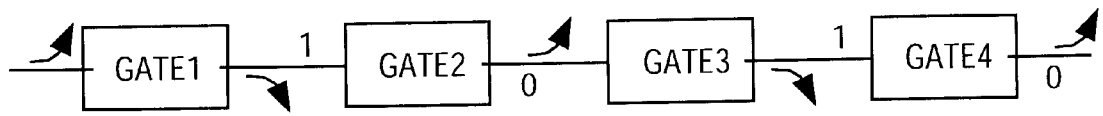
FIG. 1 is a block diagram showing the worst case behavior of a static CMOS logic chain.

In static CMOS logic, every gate is an inverting logic gate. Because of this inverting property, every output on a critical path must fully transition from 0 to 1, or 1 to 0 in the worst case. This worst case behavior is shown in FIG. 1, where we assume that the primary input transition is high. This is why static CMOS is inherently slow. A circuit designer must take into account this worst-case delay scenario for a static CMOS logic critical path.

Figure 2:
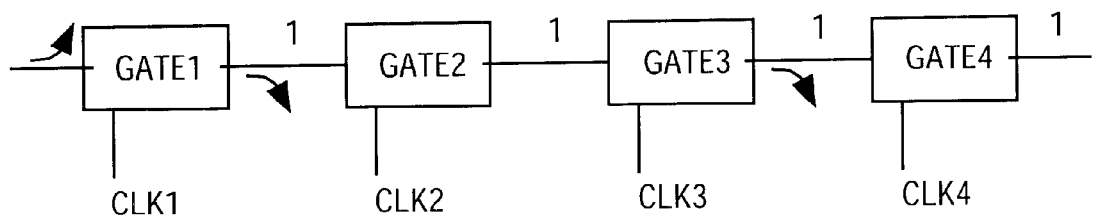
FIG. 2 is a block diagram showing a static CMOS logic chain predicting ones in accordance with the present invention.

The present invention (termed "OPL") greatly reduces the worst-case behavior of a critical path. OPL predicts that every inverting gate output on a critical path will be a logic one after the transitions are completed. Since all gates are inverting, as in static CMOS logic, the OPL predictions will be correct exactly one-half the time. As seen in FIG. 2, every other gate will not have to make any transition.

There is, however, one problem with this idea. A "1" at every output (and therefore input) is not a stable state for an inverting gate. The "1" will erode (possibly going to zero) in the latter gates of a critical path. The solution to this problem is to tri-state each gate with a clock, in which case a "1" at an input and a "1" at an output is no longer a contradiction for an inverting gate. The gates remain tri-stated until their inputs are ready for evaluation. In this manner, predicted output values are maintained until new input values dictate otherwise. Successive clocks are delayed by a clock separation as shown in FIGS. 3A–3D. This is a fundamental aspect of the present invention: that sequential levels of logic are clocked by sequentially delayed clock signals.

A tri-state, precharge-high static CMOS inverting gate implementing the above idea is shown in FIG. 4. When the clock (clk) is low, the gate is tri-stated, with the output being charged to a logic "1". When the clock goes high, the gate becomes a conventional static CMOS gate.

Figure 5:
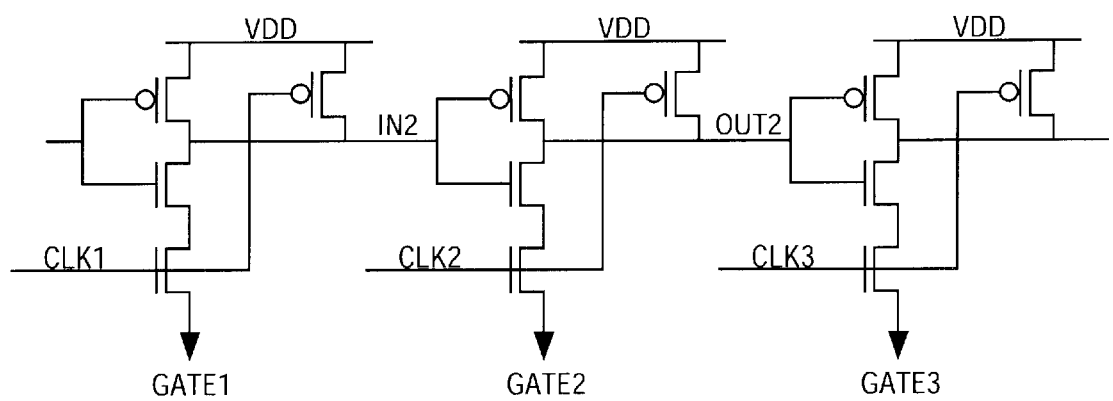
FIG. 5 is a schematic diagram of a chain of three inverters formed in accordance with the present invention.
Figure 6A:
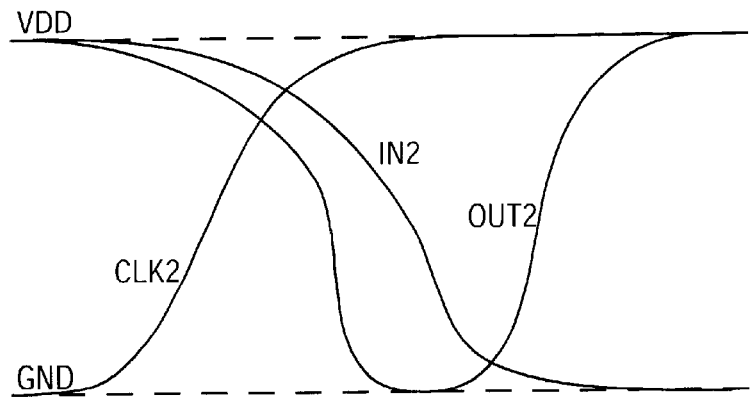
FIGS. 6A–6C are graphs that illustrate the dependency of the output of a gate upon clock arrival time.
Figure 6B:
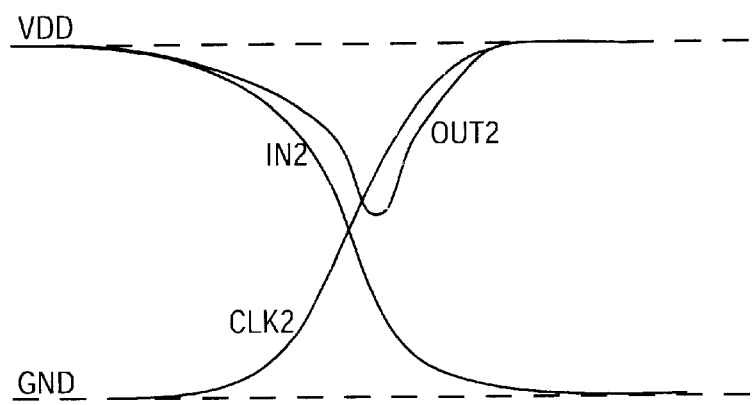
Figure 6C:
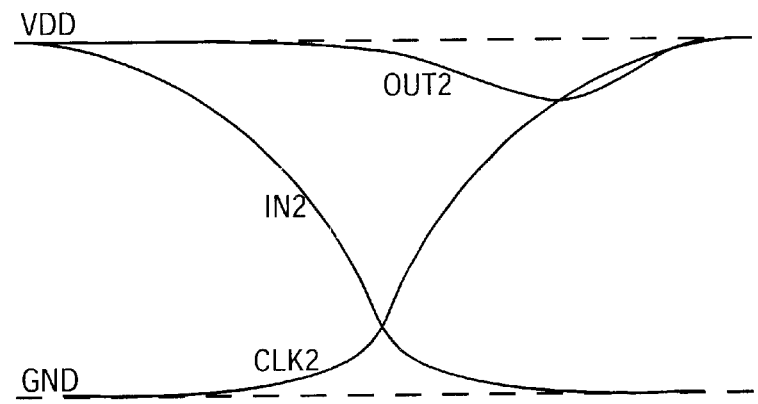

While an actual circuit essentially follows this desired behavior, there are important non-idealities. FIG. 5 shows a chain of three OPL-static inverters. First, consider the case where the input to gate 2 in FIG. 5 is low, and therefore gate 2's output should remain high. If the clock arrives (goes fully high) at gate 2 after its input becomes stable at its low value, and if the clock to gate 3 is still low, gate 2's output will stay high at the precharged (predicted) value. If the clock arrives at gate 2 while its input is settling, a small glitch occurs, as shown in FIG. 6c. If the clock is earlier falling (but not yet fully zero) inputs will cause a bigger glitch at the output of gate 2 as shown in FIG. 6b. If the clock is even earlier yet, the precharged (predicted) value is completely lost, as shown in FIG. 6a.

The magnitude of the glitch is also enhanced by Miller kickback capacitance from the load gate 3. The kickback occurs when gate 3 also glitches to some extent (for exactly the same reasons as for gate 2) or falls all the way to 0. When this happens, gate 2's output load capacitance will be at least somewhat larger than what was seen by gate 2's precharge device when gate 3 was fully precharged. Should the clock to gate 3 arrive at almost the same time as the clock to gate 2, the kickback effect will be large since gate 3 fully transitions to zero, causing a significantly greater glitch at the output of gate 2.

If it is assumed that the glitch is highly undesirable, then it is required that the rising clock (or evaluation edge) arrive after the inputs to a gate have fully settled. If this is done for all gates, then the glitch will be very small. However, in so doing, a clock-blocked circuit is created, in that the throughput of the circuit is limited by the clocks and not the data. Hence, the speedup achieved is not great.

On the other hand, if some glitching is acceptable, then the evaluation clock edge can arrive somewhat earlier than the corresponding gate inputs. This will make the circuit throughput data limited. However, if the glitches are all the way to zero as in FIG. 6a, the precharge (predicted) values are completely lost and there is no reason to believe that any speedup over a conventional static CMOS inverter chain would be achieved.

The present inventors have found that there is an optimal point between the two extremes (fully clock-blocked and fully lost precharge values). As seen below, the minimum delay occurs when a modest amount of glitch occurs, as shown in FIG. 6b.

Figure 7:
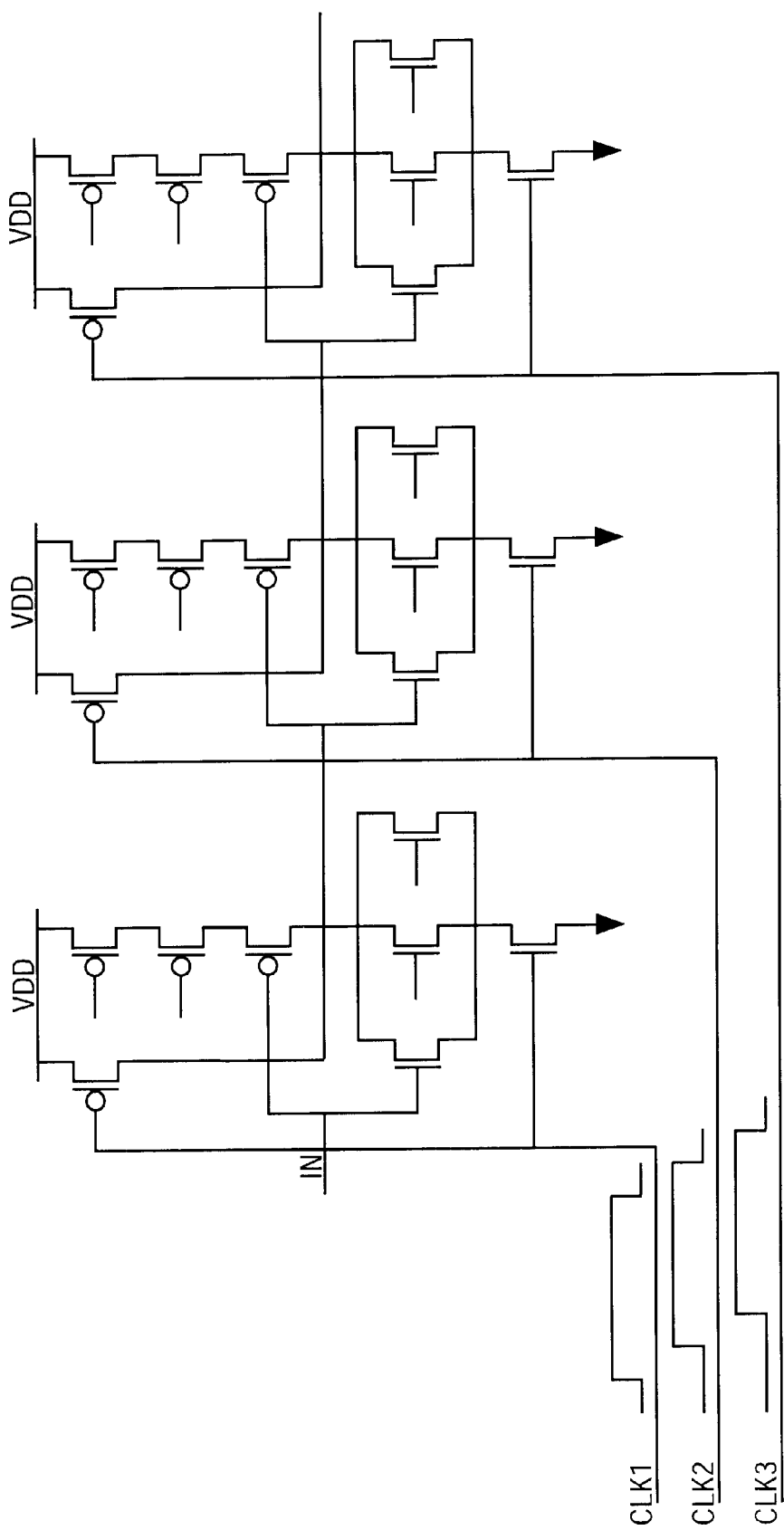
FIG. 7 is a schematic diagram of a chain of three NOR gates formed in accordance with the present invention.
Figure 8:
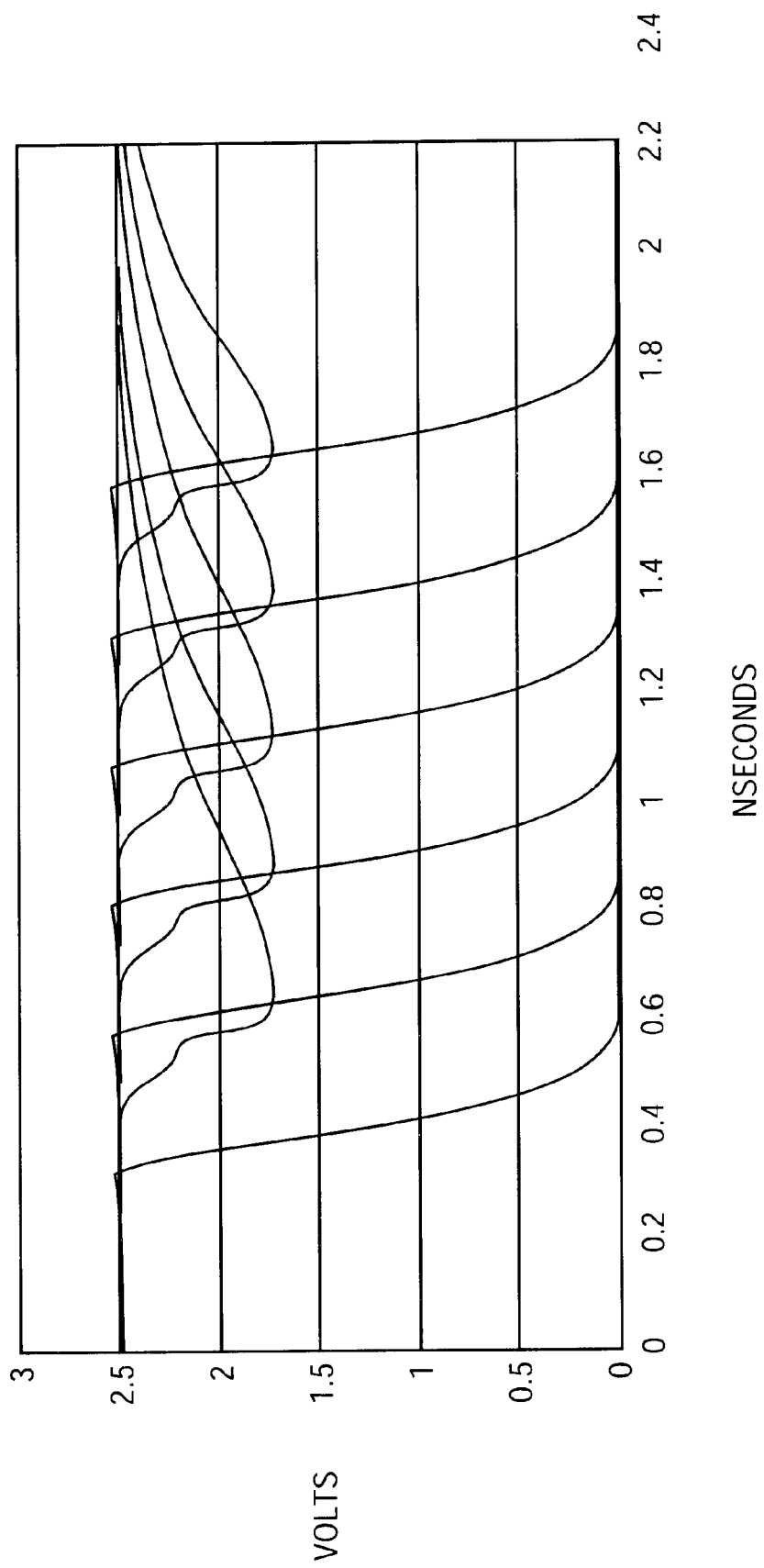
FIG. 8 is a graph that illustrates voltage waveforms for a NOR gate chain formed in accordance with the present invention at a clock separation of 0.13 nanoseconds.

FIG. 7 shows a chain of OPL-static three input NOR gates. A chain of ten NOR gates, each gate having a fanout of four identical gates was simulated using parameters from a 0.25 volt process from Taiwan Semiconductor Manufacturing Corp. of Hsinchu, Taiwan, R.O.C. An optimal clock separation can be determined experimentally, by using a circuit simulation program, such as HSPICE. In one actual embodiment, the optimal separation was found to be 0.13 nanoseconds. Waveforms for gate outputs at this separation are shown in FIG. 8. As seen, half of the outputs fall to zero and the other half dip (or glitch) and then rise back up to $V_{DD}$ (as seen in FIG. 6b).

Note that the evaluation of successive gates overlaps considerably. The objective of the present invention is to control this overlap so that low-going gates get a headstart in evaluating, while high-going gates do not glitch excessively. If the pull-up and pull-down strengths are the same, one would expect the minimum overall delay should occur when a high-going output dips to a voltage intermediate between zero and $V_{DD}$. This voltage should be near the maximum gain point, where a small change in the input will cause a large change in the output. By controlling the clock separation, we effectively position the output near this critical voltage. This contrasts to the normal operation in static CMOS, where gates begin evaluation at either zero or $V_{DD}$, where the gain is the smallest.

Positioning gate outputs at their maximum gain point in order to increase speed has been used previously in a limited context. See Zhu et al., "Critical Voltage Transition Logic: An Ultrafast CMOS Logic Family", Proc. IEEE Int'l Conf. on Computer Design (ICCD), Austin, Tex. (October 1997). In critical voltage transition logic (CVTL), a chain of pseudo-nMOS inverters is precharged low, then allowed to float simultaneously to a critical voltage (the point of maximum gain). Propagation delay is greatly reduced by this "preconditioning" of gate outputs. Unfortunately, this scheme depends on a very delicate balancing of loading and drive strengths between stages in order for the preconditioning state to hold. In a chain of arbitrary gates, outputs will typically decay from a precharged value unless explicitly prevented by a method such as the OPL delayed clocks.

Figure 9:
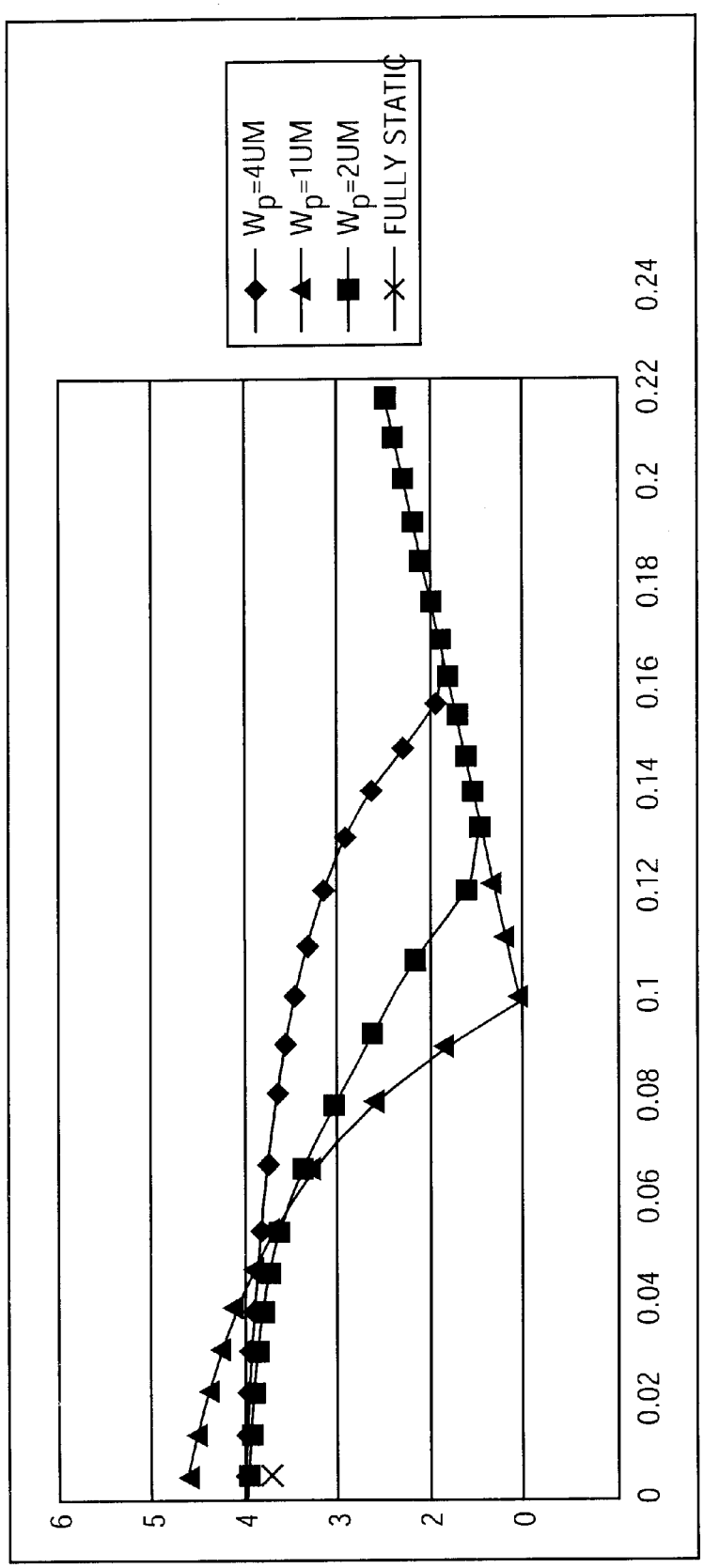
FIG. 9 is a graph that illustrates propagation delay versus clock separation for a NOR gate chain formed in accordance with the present invention.

The dependency of total delay upon the clock separation can be seen clearly from FIG. 9. Three curves are shown, corresponding to OPL-static chains with different pMOS device sizes ($W_p$) in the pull-up network (pull-down devices were all sized with $W_n$=2 μm). At zero clock separation, we have the case where every gate is precharged high and allowed to float at the same time. Nearly all the gates (except those near the beginning of the chain) will decay to alternating 1's and 0's before having to make a full swing to the opposite rail. Note that as the clock separations are increased from zero, more of the gate outputs approach an intermediate voltage before correcting. At the minimum in each curve, the clock separation is the effective gate delay. Eventually, as the clock separation continues to increase, the circuit (in effect) becomes clock-blocking and the delay increases linearly with clock separation. Thus, to determine the optimal clock separation, curves like that shown in FIG. 9 can be generated using device simulation software, and the optimal clock separation can be chosen.

The $W_p$=4 μm curve corresponds to the same $W_p$ and $W_n$ as in the fully static gate. Note that the noise margin for this gate is exactly the same as for the fully static gate. The delay at zero separation is very close to that of the fully static gate (4.0 ns vs. 3.8 ns). As one would expect, the total delay at the minimum of this curve is about half the delay at zero separation (1.9 ns vs. 4.0 ns). The width of the pMOS devices can be decreased in the pull-up network, thereby decreasing the internal loading, speeding the gates up. As $W_p$ is decreased from 4 μm to 2 μm, then to 1 μm, the minimums in the curves decrease. However, as the size is decreased, the ability of the gates to pull up and recover from a glitch is also reduced. This results in a very steep rise in the delay-separation curve before the minimum point; the circuit will be sensitive to clock skew in this region. A $W_p$ of 2 μm was chosen as a reasonable compromise between increased speed, an ability to recover from glitches, and good noise margins. Note that the noise margin for $W_p$=2 μm is only slightly less than that for $W_p$=4 μm, and is much higher than nominal domino noise margins.

Note that highly accurate clocking is not required to achieve high speedups over fully static gates. In the $W_p$=2 μm case, a 10% error in the overall average clock results in a speedup (over fully static) of 2.5 times vs. 2.8 times, if the clock were positioned at the exact minimum. Such a level of control (10%) in overall average clock skew is readily attainable today.

In the examples given herein, the circuits have used precharged-high gates. However, precharged-low gates are also possible, as well as gates that are precharged to some point between ground and $V_{DD}$.

Application to Pseudo-nMOS and Dynamic CMOS Logic

Figure 10:
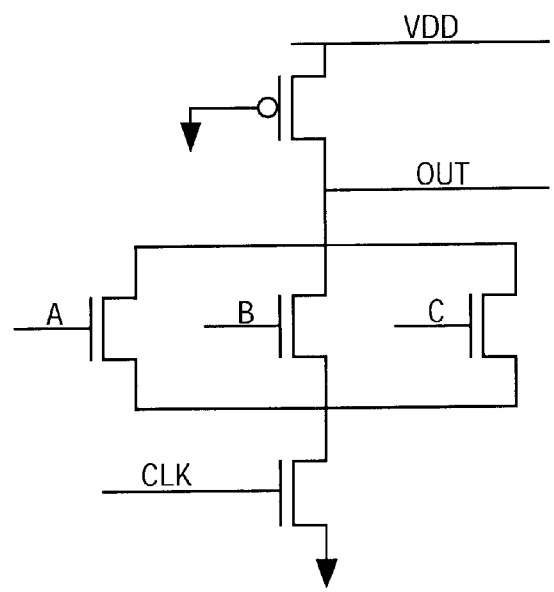
FIG. 10 is a schematic diagram of a pseudo-nMOS three input NOR gate formed in accordance with the present invention.

The OPL technique can be applied to pseudo-nMOS as well as dynamic circuits. A tri-state, precharge-high pseudo-nMOS gate is shown in FIG. 10. When the clock (clk) is low, the gate is tri-stated, with the output being charged to a logic 1. When the clock goes high, it becomes a pseudo-nMOS gate. The pull-up serves both to precharge the gate and correct a high output when it glitches. This pMOS device is sized in accordance with the pull down stack to yield an appropriate output-low voltage. Note that the output-low voltage can be set closer to zero than for conventional pseudo-nMOS since pull-up delay is less of a concern, thus lowering static power dissipation (as will be shown later). The behavior of the gate is similar to that of pseudo-nMOS. Once clk goes high, it is expected that this gate will outperform OPL-static for wide input NORs, where the pull-up chains are not as effective as a single pull-up device in correcting a high output that has glitched.

Figure 11:
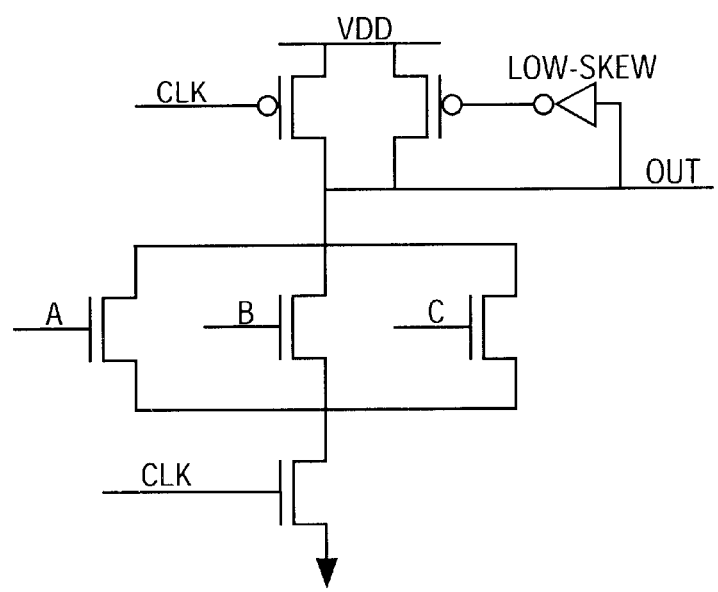
FIG. 11 is a schematic diagram of a dynamic logic three input NOR gate formed in accordance with the present invention.

The present invention was also tested with dynamic logic gates. As shown in FIG. 11, an OPL-dynamic gate looks exactly like a domino gate, but with the output inverter missing. Note that the gate precharges high, and that the keeper, if sized sufficiently large, will enable the output node to recover from glitches. If the clock arrives too early (keep in mind that the inputs precharge high), a gate may glitch so much that the keeper shuts off, causing the output voltage to remain at a value possibly well below $V_{DD}$ (or even zero). Thus, in contrast to OPL-static and OPL-pseudo, OPL-dynamic gates can fail functionally. The keeper should be sized sufficiently large to correct for glitches arising from Miller coupling (kickback) of the output to fanout gates.

Note that the OPL-dynamic gate is very different from a conventional domino gate, as it does not have a following inverter. Domino circuits are positive unate and may have critical paths that require every gate to discharge. Such circuits will therefore be slower than OPL-dynamic where one can take advantage of the alternating nature of the logical output values of the gates on critical paths to speed up the circuit. Domino circuits also generally require logic duplication to map to positive unate functions, in contrast to OPL circuits.

Generation of Clock Signals

Figure 12:
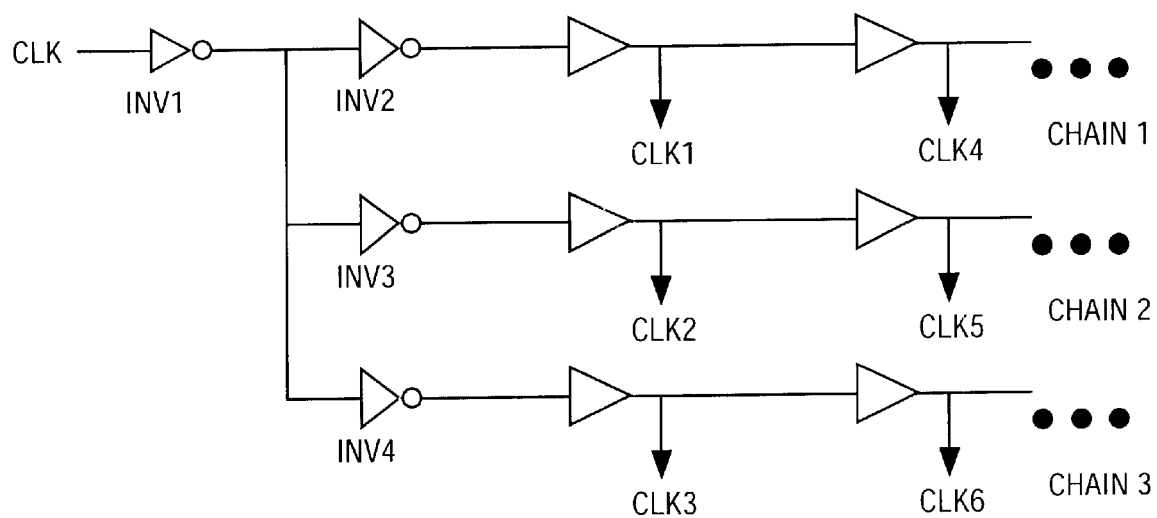
FIG. 12 is a schematic diagram illustrating a circuit for generating the clock signals used in the present invention.

The fast speed of OPL logic requires the clocks to be separated by a small amount, typically less than a buffer delay. Thus, a normal chain of delay buffers is not sufficient to generate these clocks since each clock will be separated by a buffer delay that is more than a gate delay. One scheme for generating the required clock separations is shown in FIG. 12. For example, if we want a clock separation equal to ⅓ of a buffer delay, then inverter inv2 and inv3 are sized such that chain2 lags chain1 by ⅓ of a buffer delay. Therefore, clk2 is ⅓ of a buffer delay behind clk1 and clk5 is ⅓ of a buffer delay behind clk4. Similarly, inv3 and inv4 are sized such that chain3 lags chain2 by ⅓ of a buffer delay. Thus, clk3 is ⅓ of a buffer delay behind clk2 and clk6 is ⅓ of a buffer delay behind clk5. Since clk4 is one buffer delay behind clk1 and clk3 is ⅔ of a buffer delay behind clk1, clk4 is ⅓ of a buffer delay behind clk3. As a result, all clocks are separated by ⅓ of a buffer delay. To achieve arbitrary clock separations, the buffer delay and size inv2, inv3 and inv4 is modified accordingly. Also, the number of chains may be increased or decreased accordingly. A delay-locked loop in conjunction with other circuitry may also be used to generate the required delayed clocks.

A method has been provided that can be applied to conventional CMOS logic families to obtain considerable speedups. Although one form of the present invention, OPL-static, employs clocks, it is highly tolerant to clock skew. OPL-static is faster than conventional domino logic, and since it has higher noise margins than domino logic, it will scale much better than domino with future processing technologies.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method of clocking a multilevel logic circuit, each level of the multilevel logic circuit having inverting dynamic logic gates only, each inverting dynamic logic gate implementing an arbitrary inverting logic function, each inverting dynamic logic gate driving the output to the value of the logic function when triggered by a clock signal, each inverting dynamic logic gate having all inputs and an output fully pre-charged to $V_{DD}$ (logic "1"), the method comprising:

determining a gate optimum clock arrival time for each inverting dynamic logic gate by trying all possible gate clock arrival times and choosing the gate clock arrival time that yields a minimum delay for each inverting dynamic logic gate;

determining a level optimum clock arrival time for each level by determining the maximum clock arrival time, over all gate arrival times, for all inverting dynamic logic gates in a level;

determining a multilevel logic circuit optimum delay by sequentially determining level optimum clock arrival times for each level in the multilevel logic circuit;

applying to each inverting dynamic logic gate in a given level, a clock signal at the level optimum clock arrival time for that level.

2. The method of claim 1, wherein determining the gate optimum clock arrival time for a single inverting dynamic logic gate comprises determining a minimum gate clock value for which the following conditions exist:

if the logic output of the gate is to be a logic '1', a sufficiently high voltage value on the output is maintained such that a subsequent gate interprets it as a logic '1'; and if the logic output of the gate is to be a logic '0', the voltage value on the output of the gate falls strictly monotonically, without stabilizing at an intermediate value.

3. The method of claim 1, further comprising fully pre-discharging each inverting dynamic logic gate input and output to GND (logic "0").

4. The method of claim 1, further comprising fully pre-discharging each inverting dynamic logic gate input and output to GND (logic "0"), wherein determining the gate optimum clock arrival time for a single inverting dynamic logic gate comprises determining a minimum gate clock value for which the following conditions exist:

if the logic output of the gate is to be a logic '0', a sufficiently low voltage value on the output is maintained such that a subsequent gate interprets it as a logic '0'; and if the logic output of the gate is to be a logic '1', the voltage value on the output of the gate rises strictly monotonically, without stabilizing at an intermediate value.

5. A multilevel logic circuit, comprising:

each level of the multilevel logic circuit having inverting dynamic logic gates only, each inverting dynamic logic gate implementing an arbitrary inverting logic function, each inverting dynamic logic gate driving the output to the value of the logic function when triggered by a clock signal, each inverting dynamic logic gate having all inputs and an output fully pre-charged to $V_{DD}$ (logic "1"), the clock signal for a given inverting dynamic logic gate arriving at a level-optimum clock arrival time, said level-optimum clock arrival time being the clock arrival time that yields a minimum in the delay of a logic level, said delay of a logic level for a given clock arrival time being the maximum delay over all gate delays for gates in the logic level.

6. The multilevel logic circuit of claim 5, wherein the delay of a gate triggered by its clock signal is defined as the period between the clock arrival time and the gate output transition from a logic '1' value to a logic '0', said delay is only defined for the clock arrival time when the logic '0' falling waveform falls strictly monotonically without stabilizing at an intermediate value, and when the logic '1' waveform maintains a sufficiently high voltage value that a subsequent gate interprets it as a logic '1'.

7. The multilevel logic circuit of claim 6, wherein each inverting dynamic logic gate includes a keeper coupled to enable the inverting dynamic logic gate output to recover from glitches.

8. The multilevel logic circuit of claim 6, wherein each inverting dynamic logic gate includes a keeper consisting of an implementation of the dual of the logic function of the gate, known as output prediction logic (OPL) static.

9. The multilevel logic circuit of claim 5, further comprising fully pre-discharging each inverting dynamic logic gate input and output to GND (logic "0").

10. The multilevel logic circuit of claim 9, wherein each inverting dynamic logic gate includes a keeper coupled to enable the inverting dynamic logic gate output to recover from glitches.

11. The multilevel logic circuit of claims 9, wherein each inverting dynamic logic gate includes a keeper consisting of an implementation of the dual of the logic function of the gate, known as output prediction logic (OPL) static.

12. The apparatus of claim 5, further comprising fully pre-discharging each inverting dynamic logic gate input and output to GND (logic "0"), wherein the delay of a gate triggered by its clock signal is defined as the time period between the clock arrival time and the gate output transition from a logic '0' value to a logic '1', said delay is only defined when the logic '1'0 rising waveform rises strictly monotonically without stabilizing at an intermediate value, and when the logic '0' waveform maintains a sufficiently low voltage value that a subsequent gate interprets it as a logic '0'.

13. The multilevel logic circuit of claim 12, wherein each inverting dynamic logic gate includes a keeper coupled to enable the inverting dynamic logic gate output to recover from glitches.

14. The multilevel logic circuit of claim 12, wherein each inverting dynamic logic gate includes a keeper consisting of an implementation of the dual of the logic function of the gate, known as output prediction logic (OPL) static.

15. The multilevel logic circuit of claim 5, wherein each inverting dynamic logic gate includes a keeper coupled to enable the inverting dynamic logic gate output to recover from glitches.

16. The multilevel logic circuit of claim wherein each inverting dynamic logic gate includes a keeper consisting of an implementation of the dual of the logic function of the gate, known as output prediction logic (OPL) static.

* * * * *

UNITED STATES PATENT AND TRADEMARK OFFICE
CERTIFICATE OF CORRECTION

PATENT NO. : 6,549,038 B1
DATED : April 15, 2003
INVENTOR(S) : Sechen et al.

It is certified that error appears in the above-identified patent and that said Letters Patent is hereby corrected as shown below:

Column 8,
Line 35, please delete "0".
Line 52, after the word claim please insert -- 5 --.

Signed and Sealed this

Twentieth Day of April, 2004

JON W. DUDAS
*Acting Director of the United States Patent and Trademark Office*